(12) United States Patent
Chen et al.

(10) Patent No.: US 12,418,103 B2
(45) Date of Patent: Sep. 16, 2025

(54) ANTENNA PACKAGE STRUCTURE

(71) Applicant: TRON FUTURE TECH INC., Hsinchu (TW)

(72) Inventors: Kuan-Neng Chen, Hsinchu (TW); Han-Wen Hu, Hsinchu County (TW); Yi-Chieh Tsai, Taoyuan (TW); Yu-Jiu Wang, Hsinchu (TW); Li Han Chang, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 447 days.

(21) Appl. No.: 18/066,002

(22) Filed: Dec. 14, 2022

(65) Prior Publication Data
US 2023/0402744 A1 Dec. 14, 2023

Related U.S. Application Data

(60) Provisional application No. 63/351,881, filed on Jun. 14, 2022.

(51) Int. Cl.
*H01Q 1/38* (2006.01)
*H01L 23/00* (2006.01)
(Continued)

(52) U.S. Cl.
CPC ............... *H01Q 1/38* (2013.01); *H01L 25/03* (2013.01); *H01Q 3/36* (2013.01); *H01L 24/08* (2013.01);
(Continued)

(58) Field of Classification Search
CPC . H01Q 1/38; H01Q 3/36; H01L 25/03; H01L 24/08; H01L 24/16; H01L 24/32;
(Continued)

(56) References Cited

U.S. PATENT DOCUMENTS 5,378,927 A * 1/1995 McAllister .......... H01L 23/5384
257/776
5,966,102 A * 10/1999 Runyon ................. H01Q 21/08
343/820
(Continued)

FOREIGN PATENT DOCUMENTS

CN 210897278 U 6/2020
CN 113300072 A * 8/2021 ............. H01Q 1/364
(Continued)

OTHER PUBLICATIONS

Partial European Search Report of EP family patent Application No. 23179267.2, mailed on Nov. 22, 2023.
(Continued)

*Primary Examiner* — Nuzhat Pervin
(74) *Attorney, Agent, or Firm* — WPAT, P.C.; Anthony King

(57) ABSTRACT

An antenna package structure is provided. The antenna package structure includes a glass substrate, an interconnect structure, a plurality of semiconductor chips, and an antenna array structure. The glass substrate has a first surface and a second surface opposite to the first surface. The interconnect structure is disposed over the first surface of the glass substrate. The plurality of semiconductor chips are mounted over the interconnect structure. The antenna array structure is formed on the second surface of the glass substrate. Furthermore, the plurality of semiconductor chips are coupled to the antenna array structure through the interconnect structure and the glass substrate.

17 Claims, 5 Drawing Sheets

(51) Int. Cl.
*H01L 25/03* (2006.01)
*H01Q 3/36* (2006.01)

(52) U.S. Cl.
CPC .............. *H01L 24/16* (2013.01); *H01L 24/32* (2013.01); *H01L 2224/08225* (2013.01); *H01L 2224/16227* (2013.01); *H01L 2224/32225* (2013.01)

(58) Field of Classification Search
CPC . H01L 2224/08225; H01L 2224/16227; H01L 2224/32225
USPC ........................................................ 342/371
See application file for complete search history.

(56) References Cited

U.S. PATENT DOCUMENTS

| | | | | |
|---|---|---|---|---|
| 6,320,543 | B1* | 11/2001 | Ohata .................. | H01Q 9/0407 343/846 |
| 9,153,863 | B2* | 10/2015 | Nair ...................... | H01Q 1/2283 |
| 9,196,951 | B2* | 11/2015 | Baks ...................... | H01Q 1/2283 |
| 9,460,937 | B2* | 10/2016 | Son ........................ | H01L 24/73 |
| 10,096,558 | B1* | 10/2018 | Chiang ............... | H01L 21/4853 |
| 10,103,450 | B2* | 10/2018 | Dang .................... | H01Q 21/065 |
| 10,424,550 | B2* | 9/2019 | Chiang ..................... | H01Q 5/10 |
| 10,770,394 | B2* | 9/2020 | Chen ................. | H01L 23/49827 |
| 11,380,665 | B2* | 7/2022 | Nakano ................. | H01L 23/481 |
| 11,508,675 | B2* | 11/2022 | Chen ....................... | H01L 24/19 |
| 11,532,575 | B2* | 12/2022 | Lin ........................ | H01L 24/19 |
| 12,094,860 | B2* | 9/2024 | Wang ..................... | H01Q 21/24 |
| 12,243,851 | B2* | 3/2025 | Lee ......................... | H01L 24/80 |
| 2004/0184129 | A1* | 9/2004 | Solli ..................... | G02F 1/3775 359/222.1 |
| 2012/0206669 | A1* | 8/2012 | Kim .................. | G02F 1/133308 349/153 |
| 2013/0099389 | A1* | 4/2013 | Hong ................. | H01Q 21/0025 257/774 |
| 2013/0258234 | A1* | 10/2013 | Park .................. | G02F 1/133528 349/58 |
| 2014/0266947 | A1* | 9/2014 | Chen .................... | H01Q 21/065 343/772 |
| 2015/0222014 | A1* | 8/2015 | Stevenson .............. | H01Q 13/18 342/372 |
| 2015/0340765 | A1* | 11/2015 | Dang .................... | H01Q 1/2208 343/893 |
| 2016/0056544 | A1* | 2/2016 | Garcia ................. | H01Q 9/0407 343/725 |
| 2016/0352023 | A1* | 12/2016 | Dang ........................ | H01Q 1/48 |
| 2016/0377675 | A1* | 12/2016 | Ukraintsev .......... | G01R 31/311 324/754.23 |
| 2017/0186710 | A1* | 6/2017 | Yoon ................. | H01L 23/49827 |
| 2018/0191052 | A1* | 7/2018 | Ndip ........................ | H01L 24/20 |
| 2018/0332151 | A1* | 11/2018 | Kamgaing ........... | H01Q 9/0414 |
| 2019/0181085 | A1* | 6/2019 | Chen .................... | H01L 21/568 |
| 2019/0189572 | A1* | 6/2019 | Chiang ................ | H01L 21/568 |
| 2019/0198466 | A1* | 6/2019 | Chen ....................... | H01L 24/19 |
| 2019/0221917 | A1* | 7/2019 | Kim ..................... | H01Q 1/2283 |
| 2019/0279951 | A1* | 9/2019 | Chiang .................. | H01L 24/25 |
| 2019/0280368 | A1* | 9/2019 | Khan ................... | H01Q 1/2283 |
| 2019/0333882 | A1* | 10/2019 | Kamgaing ........... | H01Q 19/005 |
| 2020/0006846 | A1* | 1/2020 | Lasiter .................. | H01Q 21/08 |
| 2020/0058605 | A1* | 2/2020 | Chen ................. | H01L 23/49811 |
| 2020/0112081 | A1* | 4/2020 | Kim ......................... | H01L 24/16 |
| 2020/0176408 | A1* | 6/2020 | Lin ......................... | H05K 1/111 |
| 2020/0203817 | A1* | 6/2020 | Chiang ................ | H01Q 1/2283 |
| 2020/0294929 | A1* | 9/2020 | Lu ....................... | H01L 23/5283 |
| 2020/0328497 | A1* | 10/2020 | Lin ........................ | H01Q 1/38 |
| 2020/0357757 | A1* | 11/2020 | Kim ..................... | H01Q 1/2283 |
| 2020/0381812 | A1* | 12/2020 | Yeh ....................... | H01L 21/565 |
| 2020/0411456 | A1* | 12/2020 | Chen ................... | H01Q 1/2283 |
| 2021/0036405 | A1* | 2/2021 | Han ..................... | H01L 23/5384 |
| 2021/0084762 | A1* | 3/2021 | Akejima ................. | H01L 24/19 |
| 2021/0098860 | A1* | 4/2021 | Kuo ...................... | H01L 21/568 |
| 2021/0118765 | A1* | 4/2021 | Kang ................. | H01L 23/5389 |
| 2022/0052434 | A1* | 2/2022 | Brockett .................. | H01Q 1/38 |
| 2022/0077077 | A1* | 3/2022 | Kim ........................ | H01L 24/16 |
| 2022/0084974 | A1* | 3/2022 | Akejima ................. | H01L 21/56 |
| 2022/0384310 | A1* | 12/2022 | Kuo ........................ | H01L 24/19 |
| 2023/0077949 | A1* | 3/2023 | Kamgaing ......... | H01L 23/49822 257/668 |
| 2023/0178530 | A1* | 6/2023 | Wang ...................... | H01L 25/16 257/659 |
| 2023/0197647 | A1* | 6/2023 | Chang Chien .... | H01L 23/49838 257/728 |
| 2024/0258287 | A1* | 8/2024 | Wang .................. | H01L 21/6836 |
| 2024/0371842 | A1* | 11/2024 | Wang .................. | H01L 21/6835 |
| 2025/0226583 | A1* | 7/2025 | Yao ........................ | H01Q 1/523 |

FOREIGN PATENT DOCUMENTS

| | | |
|---|---|---|
| JP | H0856113 A | 2/1996 |
| KR | 20220034006 A | 3/2022 |
| TW | 201011984 A | 3/2010 |
| TW | 201803043 A | 1/2018 |
| TW | 202008549 A | 2/2020 |
| WO | 2021061251 A2 | 4/2021 |

OTHER PUBLICATIONS

English translation of CN113300072A.
English translation of CN210897278U.
First office action of KR family patent Application No. 10-2023-0074046, mailed on May 23, 2024.
English translation (brief) of the First office action of KR family patent Application No. 10-2023-0074046, mailed on May 23, 2024.
Extended European Search Report of EP family patent Application No. 23179267.2, mailed on Apr. 26, 2024.
Non-final Office Action and search report of of TW family patent Application No. 111148072, mailed on Mar. 2, 2023.
English translation (brief) of the Non-final Office Action and search report of TW family patent Application No. 111148072, mailed on Mar. 2, 2023.
First office action of JP family patent Application No. 2023-097270, mailed on Aug. 6, 2024.
English translation (Dossier) of the First office action of JP family patent Application No. 2023-097270, mailed on Aug. 6, 2024.
English Abstract of JPH0856113A.

* cited by examiner

ANTENNA PACKAGE STRUCTURE

PRIORITY CLAIM AND CROSS-REFERENCE

This application claims priority to U.S. provisional application Ser. No. 63/351,881 filed Jun. 14, 2022, the disclosure of which is hereby incorporated by reference in its entirety.

FIELD

The present disclosure relates to an antenna package structure.

BACKGROUND

In modern wireless communication technologies, the phased array antenna technique has attracted a lot of attention due to its advantages such as higher gain, higher reliability, and beam steering capability as compared to conventional antenna technologies. The phased array antenna technology adopts an array of antennas arranged with well-managed antenna spacing, and thus the substrate area on which the array antennas are deployed would be much larger than the conventional non-array antennas. The substrate planarity is one of the important issues for developing a large-scale antenna array with acceptable cost. On the other hand, the radio-frequency (RF) circuit with higher circuit density and less power consumption is required to achieve better signal processing performance for the antenna array.

SUMMARY

In one exemplary aspect, an antenna package structure is provided. The antenna package structure includes a glass substrate, an interconnect structure, a plurality of semiconductor chips, and an antenna array structure. The glass substrate has a first surface and a second surface opposite to the first surface. The interconnect structure is disposed over the first surface of the glass substrate. The plurality of semiconductor chips are mounted over the interconnect structure. The antenna array structure is formed on the second surface of the glass substrate. Furthermore, the plurality of semiconductor chips are coupled to the antenna array structure through the interconnect structure and the glass substrate.

In another exemplary aspect, an antenna package structure is provided. The antenna package structure includes a substrate, a semiconductor chip, and an antenna. The substrate has a first surface and a second surface opposite to the first surface. The semiconductor chip is mounted over the first surface of the substrate. The antenna is formed on the second surface of the substrate. Moreover, the semiconductor chip is electromagnetically coupled to the antenna through the substrate.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
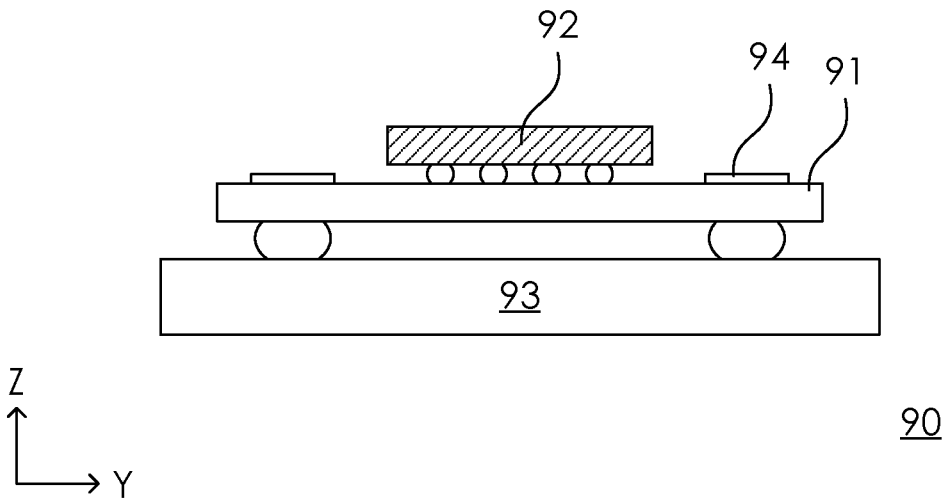
FIG. 1A illustrates a cross-sectional view of an antenna package structure according to some comparative embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

Figure 1B:
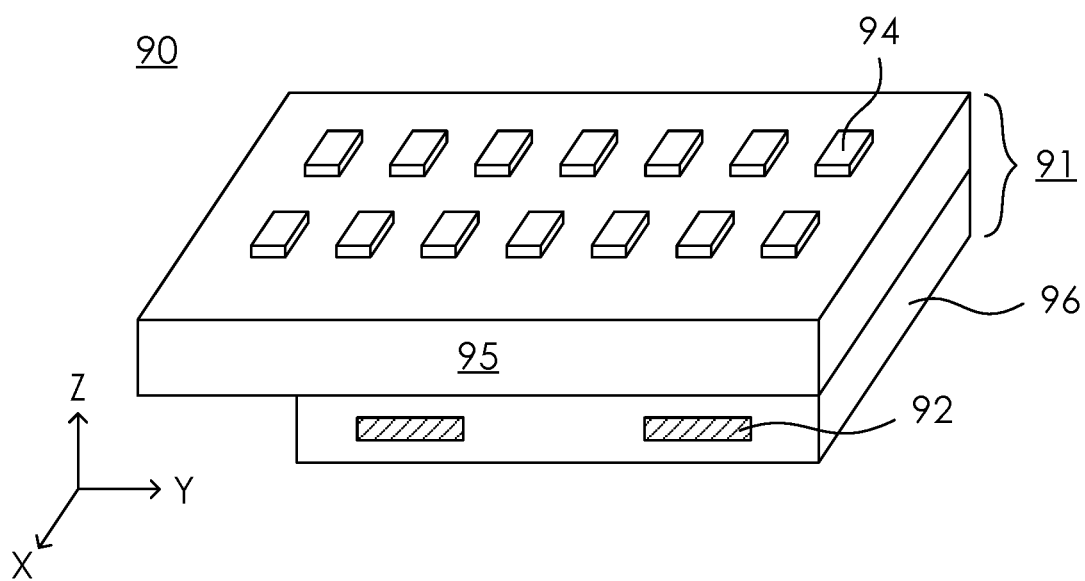
FIG. 1B illustrates a three-dimensional schematic view of an antenna package structure according to some comparative embodiments of the present disclosure.

In a comparative embodiment shown in FIG. 1A, an antenna package structure 90 having a package substrate 91 is provided. In such embodiments, the antenna package structure 90 is packaged under the Antenna-in-Package (AiP) technology. The AiP technology is an antenna package solution that implements an antenna or a plurality of antennas in an IC package that can carry a bare RF chip (transceiver). For instance, a typical AiP can include one or more RF chips 92 attached to the package substrate 91 with solder balls for connection to a printed circuit board (PCB) 93, while the array of antennas 94 is also formed on the PCB 93. In other examples, referring to FIG. 1B, the RF chips 92 can be embedded in a liquid crystal polymer (LCP) layer 95. The LCP layer 95 is attached to a side of a flexible PCB (FPCB) 96, while the array of antennas 94 is formed on another side of the FPCB 96.

Figure 1C:
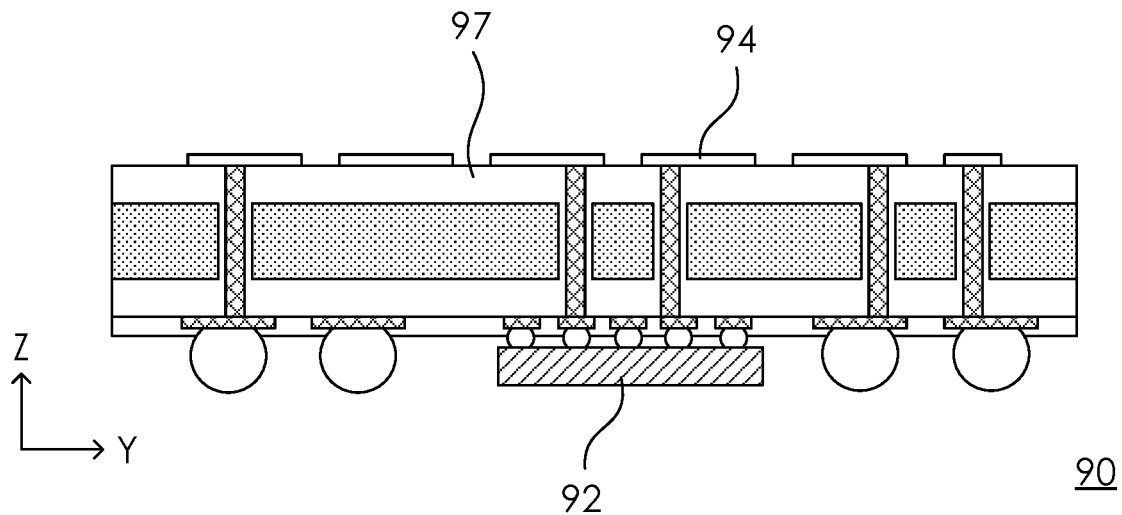
FIG. 1C illustrates a cross-sectional view of an antenna package structure according to some comparative embodiments of the present disclosure.

In other comparative embodiment shown in FIG. 1C, the PCB used in an antenna package structure 90 can be a high density interconnector (HDI) PCB 97, which is a PCB with a higher wiring density per unit area than traditional PCBs. In general, HDI PCBs are defined as PCBs with one or all the features that, including microvias; blind and buried vias; built-up laminations; and high signal performance considerations. By using HDI technology, designers can place more components on both sides of the raw PCB. Through using multiple via processes, including via-in-pad and blind via technology, the components can be placed closer, while the size of the components are decreased for more I/O in smaller geometries. The HDI PCB 97 can have up to about 16 metal layers inside. The parasitic capacitance in the HDI PCB 97 is low, however, the thermal expansion coefficient of the HDI PCB 97 is high enough to induce the situations of profile defects such as warpage.

Figure 1D:
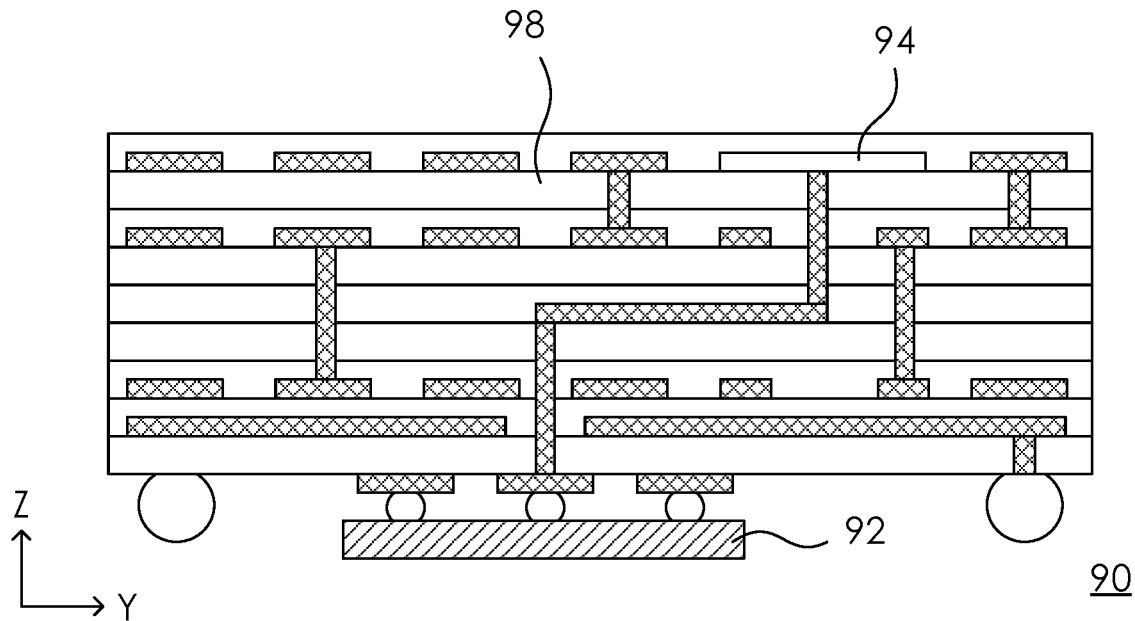
FIG. 1D illustrates a cross-sectional view of an antenna package structure according to some comparative embodiments of the present disclosure.

Other than the HDI PCB 97, the PCB in FIG. 1D can be a low temperature co-fired ceramics (LTCC) substrate 98, which is an alternative glass-ceramic multilayer substrate. LTCC is a laminate technology that can be used in high-frequency modules, substrates for semiconductor packages, and substrates for applications that require environmental resistance. For instance, since the material includes ceramic, LTCC has excellent heat and moisture resistance and no outgas sing. The LTCC substrate 98 can have up to about 60 metal layers inside. In addition, since the thermal expansion coefficient of the LTCC substrate 98 is relatively close to that of silicon, it is an advantageous substrate for bare chip mounting. However, the high cost, the low precision, the less accurate alignment between layers, and the shrinkage issue during sintering of the LTCC substrate 98 has restricted the application thereof.

Figure 2:
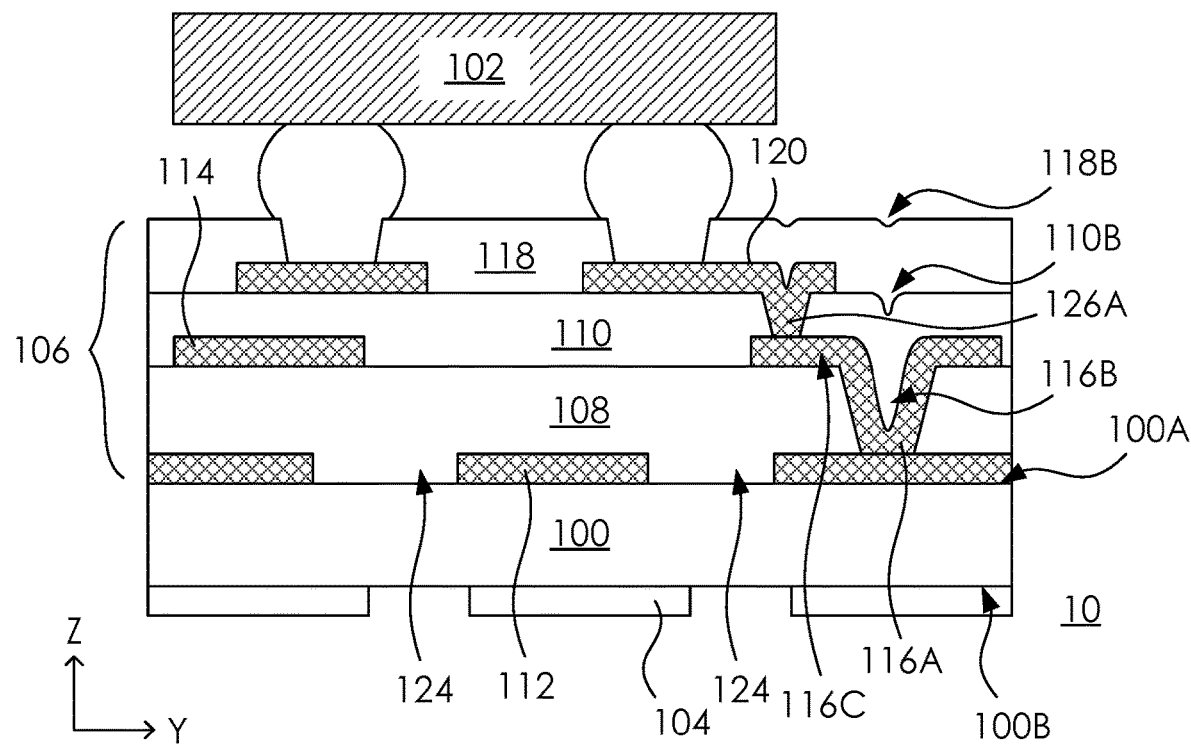
FIG. 2 illustrates a cross-sectional view of an antenna package structure according to some embodiments of the present disclosure.

Referring to FIG. 2, in some embodiments of the present disclosure, an antenna package structure 10 having a glass substrate is provided. The antenna package structure 10 includes a substrate 100, a plurality of semiconductor chips 102, and an antenna array structure 104. The substrate 100 includes a first surface 100A and a second surface 100B opposite to the first surface 100A. In some embodiments, the substrate 100 includes a planar profile and hence both of the first surface 100A and the second surface 100B are substantially flat and in parallel to each other. To ensure the flatness of the two main sides of the substrate 100 is one of the items that should be considered in selecting the materials of the substrate 100.

That is, even though a silicon substrate (e.g., a silicon wafer, a silicon-based printed circuit board, etc.) is used to be a common option in the current electrical technology, however, in the circumstances that the substrate is implemented in some of the antenna package structures that need to have a large area, for example, a substrate having an area of 20 cm square, the silicon substrate would not be a priority option due to the cost and the flatness issues. To be more detailed, the flatness of the silicon wafer might be acceptable in manufacturing the antenna package structures, however, the cost of the silicon wafer is a significant barrier. Moreover, the circular shape of the silicon wafer is also not suitable for the antenna package structures. Despite the option of silicon wafer, the substrates such as typical printed circuit boards are not applicable as well since these substrates cannot provide a substantial planar surface in a large area.

Thus, in some embodiments of the present disclosure, the substrate 100 is a glass substrate. The substrate made of glass can have a privilege in both aspects of low-cost and outstanding flatness. In some embodiments, the substrate 100 has a rectangular shape or a square shape that has four straight sides. In some embodiments, the length of a side of the substrate 100 (i.e., the side length of the substrate 100) is no less than about 20 cm. In some embodiments, the length of a side of the substrate 100 is no less than about 40 cm. In some embodiments, the length of a side of the substrate 100 is no less than about 80 cm, and so that the antenna package structure can have an area no less than about 80 cm*80 cm, which is much greater than the scales of the general silicon substrates. In other words, the substrate 100 implemented in the present disclosure has a size in a panel-level, whereas the size of the substrate for forming typical semiconductor structures is in a wafer-level. In some embodiments, the substrate 100 in the present disclosure can be provided by the thin-film transistor (TFT) panel technique, such as 3.5th-generation facility. In addition, by using the TFT panel technique, the line width of the antenna package structure 10 can be significantly narrower than the line width in an ordinary PCB (e.g., HDI PCB, LTCC substrate, or the like). For example, the line width can be narrow to about ⅛ of that in the ordinary PCB, and therefore a reduction of parasitic capacitance and signal loss can be acquired. In some embodiments, the glass material for forming the substrate 100 can be the transparent materials alike to glass, such as fused silica, silicon oxide, quartz, or the like.

Since the substrate 100 in the present disclosure is used for the field of antenna package structure, the area of the substrate 100 has to correspond to the structures of antenna. Comparing with the substrates (e.g., semiconductor substrates, silicon wafers, etc.) for forming semiconductor devices, the density of the semiconductor devices formed on the substrates should be as high as possible to lower down the average cost of the semiconductor devices. In other words, the semiconductor devices are formed on the substrate in a dense arrangement. In contrast, in the present disclosure, the structures of antenna are not arranged on the substrate 100 in a dense arrangement, because the intervals or pitches between the structures of antenna is related to the wavelength of antenna (e.g., ½ λ). Furthermore, the semiconductor devices formed on the substrate in a dense arrangement will be diced along the scribe lines of the substrate eventually, however, the substrate 100 in the present disclosure is for positioning at least an antenna array thereon, and will be implemented as a final product without further separating these antenna structures.

In addition, in some embodiments, the feature of the substrate 100 is not only a glass-made large area substrate, but a glass substrate with significant thin thickness. In some embodiments, the thickness of the substrate 100 is no greater than about 5 mm. In some embodiments, the thickness of the substrate 100 is no greater than about 3 mm. In some embodiments, the thickness of the substrate 100 is no greater than about 2 mm. In some embodiments, the thickness of the substrate 100 is in a range of from about 0.5 mm to about 1.5 mm. In some embodiments, the thickness of the substrate 100 is based under the considerations of the parameters of dielectric constant (Dk) and dielectric loss (Df) according to a specific working frequency of the antenna structures. Generally, a substrate made of glass may have a sort of advantages such as good insulating property and low electrical loss (particularly at high working frequencies).

In the circumstance that the substrate 100 is a glass-made large area with thin thickness, in some embodiments of the present disclosure, the substrate 100 is a via-free glass substrate. In other words, in this embodiment, there has no conductive via structure or through glass via is formed in the substrate 100. In the field of semiconductor manufacturing, there are some glass substrates that can be drilled to have a plurality of through holes for semiconductor package, for forming glass interposers, for forming 3D glass integrated passive devices (IPD), for forming MEMS or sensor devices, etc. These through holes in the glass substrate are called through glass vias (TGV), which can be formed by the technique of laser drilling or etching. However, because the cost in forming the TGV is high, and the yield and strength of the substrate can be decreased at the same time as well, hence in some embodiment of the present disclosure, the profile of the substrate 100 is intact, without having any through holes, trenches, recesses, or the like.

As shown in FIG. 2, in some embodiments, an interconnect structure 106 is formed over the first surface 100A of the glass substrate 100. In some embodiments, the interconnect structure 106 includes one or more redistribution layers (RDL). The plurality of semiconductor chips 102 are mounted over the interconnect structure 106. In some embodiments, the interconnect structure 106 includes a plurality of dielectric layers, while these dielectric layers include a plurality of conductive layers (or called redistribution layers) and conductive vias embedded therein. In some embodiments, the redistribution layers and conductive vias are formed of conductive materials, such as copper, tungsten, aluminum, titanium, tantalum, alloys thereof, or the like.

As illustrated in FIG. 2, in some embodiments, the interconnect structure 106 includes a first dielectric layer 108 disposed on the first surface 100A of the substrate 100, and a second dielectric layer 110 stacked disposed on the first dielectric layer 108. Furthermore, within the stack of the plurality of dielectric layers, a first redistribution layer 112 is formed on the first surface 100A of the substrate 100, and a second redistribution layer 114 is formed on an upper surface of the first dielectric layer 108. In some embodiments, the first redistribution layer 112 is a conductive metal pattern embedded in the first dielectric layer 108, and the second redistribution layer 114 is another conductive metal pattern embedded in the second dielectric layer 110. In some embodiments, the first redistribution layer 112 and the second redistribution layer 114 are electrically connected through the conductive vias in the interconnect structure 106. The numbers of the dielectric layers in the interconnect structure 106 is depending on the layout design of the antenna package structure. For example, three or more dielectric layers is feasible in the scenario that more power lines are needed.

In some embodiments, the first dielectric layer is formed between the glass substrate and the second dielectric layer. In some embodiments, the first dielectric layer 108 is configured to have the first redistribution layer 112 for forming a plurality of apertures for transmitting RF signals to the antenna array structure 104 through the substrate 100. In some embodiments, the first redistribution layer 112 is electrically connected to a ground voltage. In some embodiments, the second dielectric layer 110 is configured to have the second redistribution layer 114 for conducting a supply power. The second redistribution layer 114 may be configured to be the signal ports for transmitting signals to/from the corresponding locations of the apertures.

In some embodiments, at least a number of the conductive vias includes a dimple profile and thus the dielectric layers formed thereon can duplicate such dimple profile to a certain degree. That is, as shown in FIG. 2, a first conductive via 116A includes a dimple profile 116B and thus a portion of the second dielectric layer 110 is embedded into the dimple profile 116B of the first conductive via 116A. Meanwhile, the second dielectric layer 110 can have a dimple profile 110B which is duplicated from the dimple profile 116B in a certain degree. The dimple profile 110B is formed directly over the dimple profile 116B of the first conductive via 116A. Likewise, more dimple profiles (e.g., dimple profile 118B) can be formed directly over the dimple profile 110B if there is any additional layer formed over the second dielectric layer 110. Generally, the dimple profile 116B of the first conductive via 116A can affect the flatness of at least several layers formed over the first conductive via 116A.

In other words, the flatness of the second dielectric layer 110 and the flatness of the second redistribution layer 114 can be reduced by the first conductive via 116A formed there below. Therefore, in some embodiments, viewing to the projection direction between the interconnect structure 106 and the substrate 100, the conductive vias formed in the interconnect structure 106 are staggered from each other, since these conductive vias have to land on a plain conductive material. For instance, a second conductive via 126A in the second dielectric layer 110 is staggered from the first conductive via 116A in the first dielectric layer 108 to avoid the dimple profile 116B (i.e., not vertically aligned with each other), while the first conductive via 116A is connected to the second redistribution layer 114 by an extending portion 116C of the first conductive via 116A. It can also be said that the extending portion 116C of the first conductive via 116A is a portion of the second redistribution layer 114. Thus, the second redistribution layer 114 can be free from effect by the dimple profiles 116B and can have a plain top surface for the landing of the second conductive via.

In some embodiments, a third dielectric layer 118 can be disposed on the second dielectric layer 110. In some embodiments, the second dielectric layer 110 is formed between the third dielectric layer 118 and the first dielectric layer 108. The third dielectric layer 118 is configured to have a third redistribution layer 120. In some embodiments, the third redistribution layer 120 is functions as a digital and RF fan-out layer. In some embodiments, the third redistribution layer 120 can be used for conducting the RF signals having a frequency in a range of from about 10 GHz to about 28 GHz. Moreover, the third dielectric layer 118 is a top layer in the interconnect structure 106, and so that the third dielectric layer 118 also functions as a solder resist layer (i.e., solder mask) for soldering on the interconnect structure 106. In some embodiments, the third redistribution layer 120 includes a plurality of conducive lines exposed from the dielectric material of the third dielectric layer 118, and the semiconductor chips 102 are mounted on the conductive lines. In other words, the third redistribution layer 120 is configured to receive/transmit digital and RF from/to the semiconductor chips 102.

In some embodiments, the dielectric material used in the interconnect structure 106 are insulating materials, such as polyimide, epoxy resin, etc. In some embodiments, each of the dielectric layers in the interconnect structure 106 are thin polymeric layers. For instance, the material of the first dielectric layer 108 and the second dielectric layer 110 can include polyimide. In some embodiments, the material of the third dielectric layer 118 is identical to the material of the dielectric layer covered thereby. The selection of the dielectric material of the interconnect structure 106 is related to the thickness requirement of the dielectric layer. That is, in some embodiments of the present disclosure, the thickness of the dielectric layer (e.g., the first dielectric layer 108) is about 50 µm. In some embodiments, the thickness of the dielectric layer is no less than about 30 µm. In some embodiments, the thickness of the dielectric layer is no less than about 10 µm. In some embodiments, the thickness of the first dielectric layer 108 is about 20 µm to about 60 µm, and the thickness of the second dielectric layer 110 is about 10 µm. Compared with the dielectric layer made of polyimide in the present disclosure, the thickness of the dielectric layer in a typical semiconductor is much thinner. For instance, the thickness of the dielectric layers in a typical semiconductor are usually less than about 5 µm (e.g., about 2 to 3 µm or less), while these thin dielectric layers are usually made of silicon oxide. In other words, because of the thickness requirement in forming the antenna package structure, some common dielectric material used in the semiconductor structure are not feasible in the present disclosure.

In addition, the thickness of each of the dielectric layers in the interconnect structure 106 can be different from each other. For example, the thickness of the first dielectric layer 108 can be different from the thickness of the second dielectric layer 110 adjoined to the first dielectric layer 108. In some embodiments, the thickness of the dielectric layer is related to the signal transmission there through. For instance, as the embodiment illustrated in FIG. 2, the first dielectric layer 108 is thicker than the second dielectric layer 110, because the thickness of the first dielectric layer 108 is corresponding with the radio frequency (RF) signal transmitted there through. In the scenario that the thickness of the dielectric layer is about 10 µm or less (e.g., 6 µm), the frequency of the RF signal transmitted there through should be at about 50 GHz or about 60 GHz to acquire a preferred signal transmission quality. Instead, in the scenario that the frequency of the RF signal transmitted through the dielectric layer (i.e., passing the dielectric layer by the conductive material therein) is in a range of from about 10 GHz to about 28 GHz (or at about 10 GHz or at about 28 GHz), the thickness of the dielectric layer should be increased to about 50 µm to maintain the quality of the signal transmission. In other words, the thickness of dielectric layer in the present application is adjustable, depending on the frequency of the RF signal transmitted designed for the antenna package structure. Furthermore, the thicker dielectric layer, i.e., the dielectric layer implemented to transmit an RF signal having a frequency in a range of from about 10 GHz to/and about 28 GHz, can be the first dielectric layer 108 or the second dielectric layer 110, depending on which layer is the transmission path designed there to. In some embodiments, the thickness of the second dielectric layer 110 is greater than the thickness of the third dielectric layer 118.

In some embodiments, the first redistribution layer 112 is configured to provide grounding and provide apertures for electromagnetic coupling (which will be described in later paragraphs). An aperture may be an opening formed on a metal layer with a specific pattern. In some embodiments, the second redistribution layer 114 is configured to connect with the power and for the transition. In some embodiments, the third redistribution layer 120 can be disposed over the second dielectric layer 110, while the third redistribution layer 120 is configured to provide the RF and digital fan-out as previously mentioned.

Figure 3:
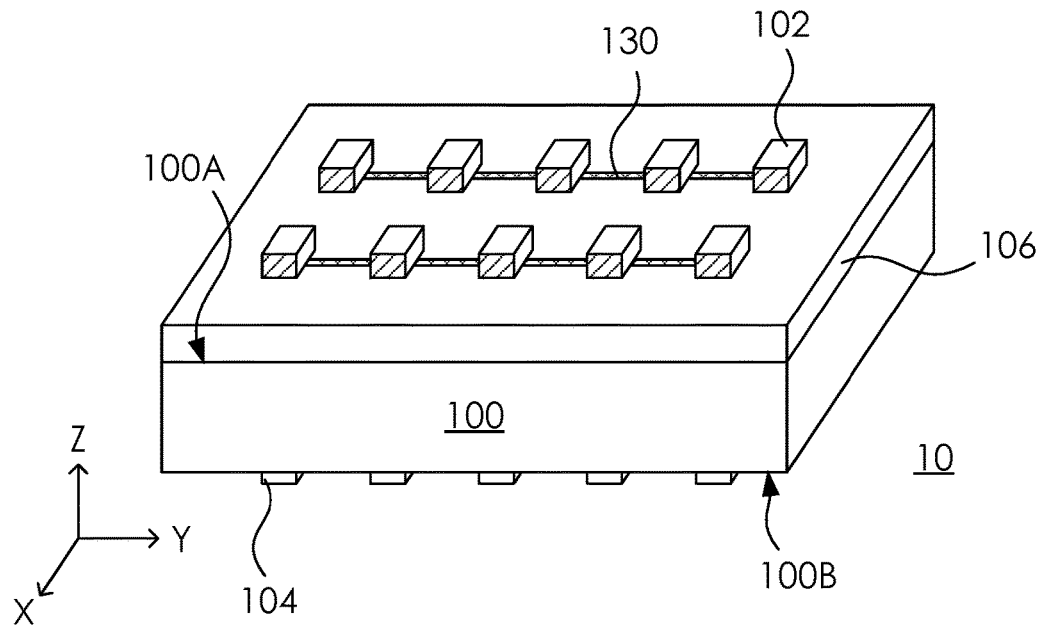
FIG. 3 illustrates a three-dimensional schematic view of an antenna package structure according to some embodiments of the present disclosure.

In some embodiments, there are no greater than three redistribution layers in the interconnect structure 106. The number of layers of the interconnect structure 106 is typically related to the numbers of the semiconductor chips 102 mounted over the interconnect structure 106. In the circumstances that there are 16*16 or 32*32 chips or dies mounted over a general PCB, the PCB needs to have seven or eight metal layers for connecting these chips or dies through the complicated routing in the PCB. However, in some embodiments of the present disclosure, since the semiconductor chips 102 mounted over the interconnect structure 106 can be connected by the significant pattern of the topmost redistribution layer in the interconnect structure 106, these semiconductor chips 102 are already be interconnected through a plurality of conductive lines 130 (see FIG. 3) in proximity to the top surface of the interconnect structure 106, and so that the number of redistribution layers of the interconnect structure 106 can be simplified to two or three layers, without using the complicated routing as above mentioned. These conductive lines 130 are exposed from the dielectric material of the topmost dielectric layer in the interconnect structure 106.

As previously mentioned, the conductive via in the dielectric layer can have the dimple profile at the top surface thereof. In some embodiments, the depth of the dimple profile is corresponding to the aspect ratio of the conductive vias from a cross-sectional view. For instance, in the event that the thickness of the first dielectric layer 108 is greater than the thickness of the second dielectric layer 110, the depth of the dimple profile 116B of the first conductive via 116A (which is laterally surrounded by the first dielectric layer 108) is greater than the dimple profile 110B of a second conductive via 126A in the second dielectric layer 110. In some embodiments, a portion of the second dielectric layer 110 is embedded in the first dielectric layer 108 by protruding toward the first dielectric layer 108. In other words, the lowest point (i.e., the point edge of the dimple profile 116B) of a bottom surface of the second dielectric layer 110 can be lower than a top surface of the first dielectric layer 108 (i.e., such lowest point is more proximity to the substrate 100 than the top surface of the first dielectric layer 108) due to the recess provide by the dimple profile 116B.

The dimple profile 110B is formed directly over the first dimple profile 116B of the first conductive via 116A. Likewise, more dimple profiles can be formed directly over second dimple profile 110B if there is any additional layer formed over the second dielectric layer 110. As previously mentioned, the dimple profile of the conductive via can affect the flatness of the dielectric layer formed thereover. Even though the dielectric layers formed over the conductive via can compensate the dimple profile in a degree, however, in the circumstance that there are only two or three dielectric layers in the interconnect structure 106, such as some embodiments in the present disclosure, it is possible that the top surface of the interconnect structure 106 still may present the dimple profiles. Therefore, in some embodiments, each and every one of the conductive vias in the interconnect structure 106 are staggered from each other.

The interconnect structure 106 and the plurality of semiconductor chips 102 are the structures disposed over the first surface 100A of the substrate 100, and corresponding to these structures, the antenna array structure 104 is disposed on the second surface 100B of the substrate 100, and therefore the substrate 100 is sandwiched by the antenna array structure 104 and the interconnect structure 106, accordingly.

In some embodiments, the antenna array structure 104 includes a plurality of phased array antennas. The phased array antenna is an array antenna whose single radiators can be fed with different phase shifts. In some embodiments, the phased array antennas of the antenna array structure 104 are wirelessly coupled to the semiconductor chips 102 through the interconnect structure 106 and the substrate 100. The phased array antennas are one-to-one mapping to the semiconductor chips 102. That is, each of the semiconductor chips 102 is electromagnetically coupled to an antenna (i.e., phased array antenna) through the substrate 100. In one embodiment, each of the semiconductor chips 102 is located directly above (or below) the corresponding antenna with the substrate 100 and the interconnect structure 106 in between. In other embodiments, each of the semiconductor chips 102 is not located directly above (or below) the corresponding antenna. For example, the semiconductor chip 102 may be slightly deviated from the location of the corresponding antenna viewing to the top of the antenna array structure 104.

As previously mentioned, the glass made thin substrate in some embodiments of the present disclosure is via free, which means it is free from having via holes penetrating through the glass substrate (e.g., forming a plurality of TGV), thus the first surface 100A and the second surface 100B of the substrate 100 are entirely plain and intact. In order to wirelessly couple the antenna array structure 104 and the semiconductor chips 102 through the interconnect structure 106 and the substrate 100, while the antenna array structure 104 and the semiconductor chips 102 are disposed on two opposite sides of the substrate 100, the electromagnetic coupling technique is thus applied.

That is, in some embodiments, the communication between the antenna array structure 104 and the semiconductor chips 102 is based on the RF signals passing through the transparent substrate 100. In some embodiments, one of the redistribution layers is arranged to form one or more apertures on the first surface 100A of the substrate 100, while the aperture is configured to transmit or emit electromagnetic signals. In some embodiments, the first redistribution layer 112 covered by the first dielectric layer 108 may provide a plurality of apertures 124 formed on the first surface 100A of the substrate 100 for directing the RF signals, including coupling signals from the interconnect structure 106 to the antenna array structure 104 or coupling signals from the antenna array structure 104 to the interconnect structure 106. For example, each of the apertures 124 can be functioned as a lens to direct the RF signals passing the substrate 100 for communicating between the antenna array structure 104 and the semiconductor chips 102. Generally, the width of the apertures 124 cannot be too narrow, otherwise such aperture 124 might induce the diffraction of RF signals. Therefore, in some embodiments, the width of the aperture 124 is greater than a lower limit in preventing the generation of diffraction, and be less than an upper limit to ensure the width is at least corresponding to perform the electromagnetic coupling of the signals (i.e., to transmit the electromagnetic signals). In some embodiments, each of the apertures 124 may be grouped with a correction aperture for transmitting correction electromagnetic signals accompanied by the previously mentioned RF signals passing through the apertures 124. In some embodiments, the width of each of the apertures 124 is identical to the width of the correction aperture grouped therewith. In some embodiments, each of the apertures 124 is adjacent to the correction aperture grouped therewith. The group composed of the apertures 124 and the correction aperture can provide the correction function for the antenna array structure 104. Particularly, since the phased array antennas are arranged in an array on the second surface 100B of the substrate 100, the signals belonging to different phased array antennas can interference each other, and therefore the self-correction design through the groups of apertures can ensure the working quality of the antenna array. For example, to provide a high quality circular polarized antenna performance in an array distribution under a suitable correction calculation.

In some alternative embodiments, in spite of some considerations such as cost, the semiconductor chips 102 and the antenna array structure 104 are not communicated through the RF signals radiated across the transparent, glass substrate 100, but the signals are transmitted through the physical lines formed in the substrate, such as passing through the TGV as aforementioned. These alternative embodiments are still selectable in some rare situations.

Figure 4:
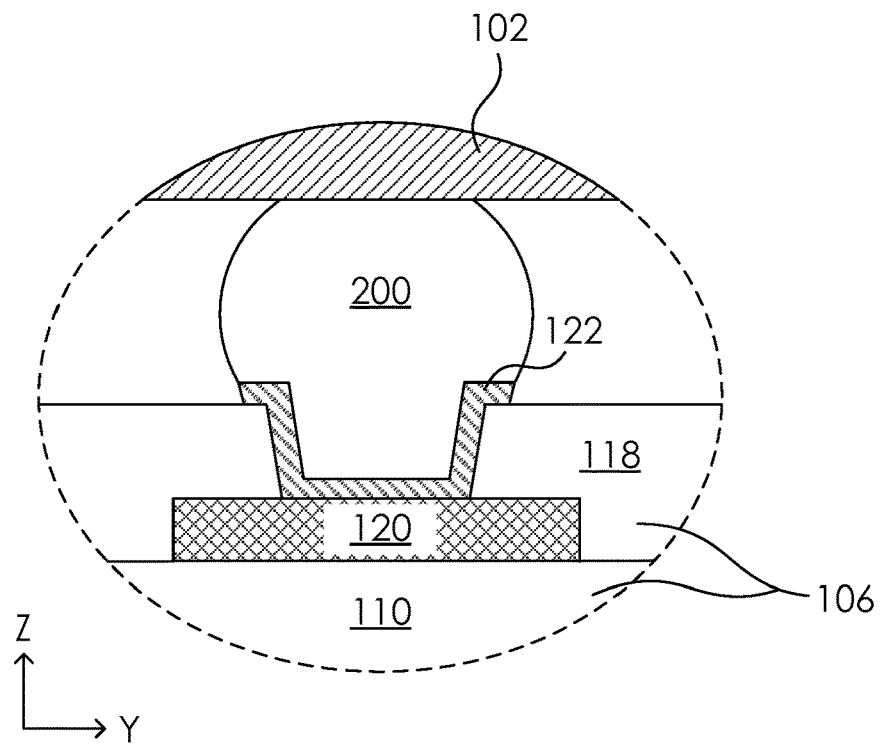
FIG. 4 illustrates a cross-sectional view of an antenna package structure according to some embodiments of the present disclosure.

Referring to FIG. 4, in some embodiments, a plurality of solder bumps 200 or solder balls (FIG. 4 illustrates one of them) can be used to bond the semiconductor chips 102 over the interconnect structure 106. The plurality of solder bumps 200 are formed in the openings of the topmost dielectric layer. For example, like the third dielectric layer 118 illustrated in the figure. In some embodiments, a UBM (Under Bump Metallization) layer 122 can be formed below each of the solder bumps 200 in the openings. Compared with Cu pillar bumps, the cost in forming these lead-free solder bumps 200 are lower. Moreover, compared with other metal bump structures, the solder bumps 200 can provide a better reliability than eutectic (EU) bumps.

Because the topmost dielectric layer is used as a solder resist layer, the topmost dielectric layer (e.g., the third dielectric layer 118) can cover at least a portion of each of the conductive metals (e.g., the third redistribution layer 120) to be connected with the solder materials. As shown in the figure, the width of each of the openings of the third dielectric layer 118 is smaller than the width of the conductive pads (i.e., the topmost redistribution layer, such as the third redistribution layer 120). Generally, the solder resist layer is used to prevent the risk of short circuits between conductive lines and pads during soldering and subsequently. In some embodiments of the present disclosure, the topmost dielectric layer is implemented as the solder resist layer, and the openings of the topmost dielectric layer can expose the conductive pads for forming the UBM and/or the solder bumps 200.

The semiconductor chips 102 in the present disclosure can be RX chips (e.g., receivers) or TX chips (e.g., transmitters), depending on the type of the antenna package structure. That is, the semiconductor chips include a plurality of transmission chips for transmitting RF signals to the antenna array structure 104 through the interconnect structure 106 and the substrate 100, or a plurality of receiving chips for receiving RF signals from the antenna array structure 104 through the interconnect structure 106 and the substrate 100. Moreover, within a single antenna package structure, all the semiconductor chips 102 mounted over the interconnect structure 106 should be RX chips or TX chips, instead of mixing the RX chips and the TX chips in one antenna package structure.

Figure 5:
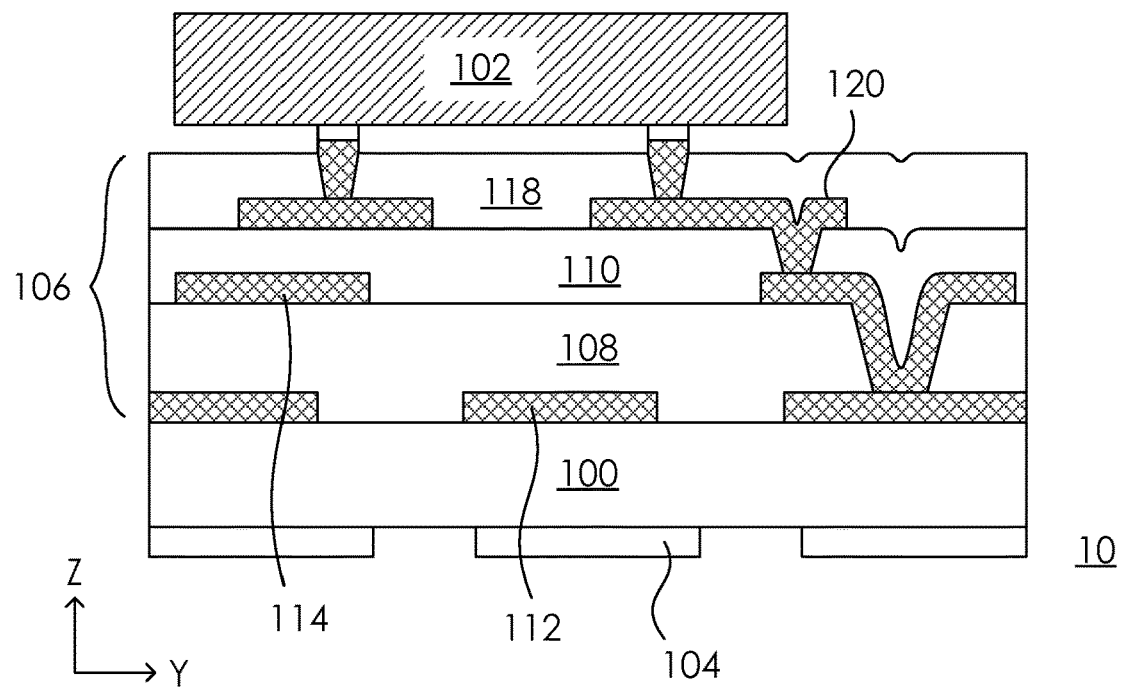
FIG. 5 illustrates a cross-sectional view of an antenna package structure according to some embodiments of the present disclosure.
Figure 6:
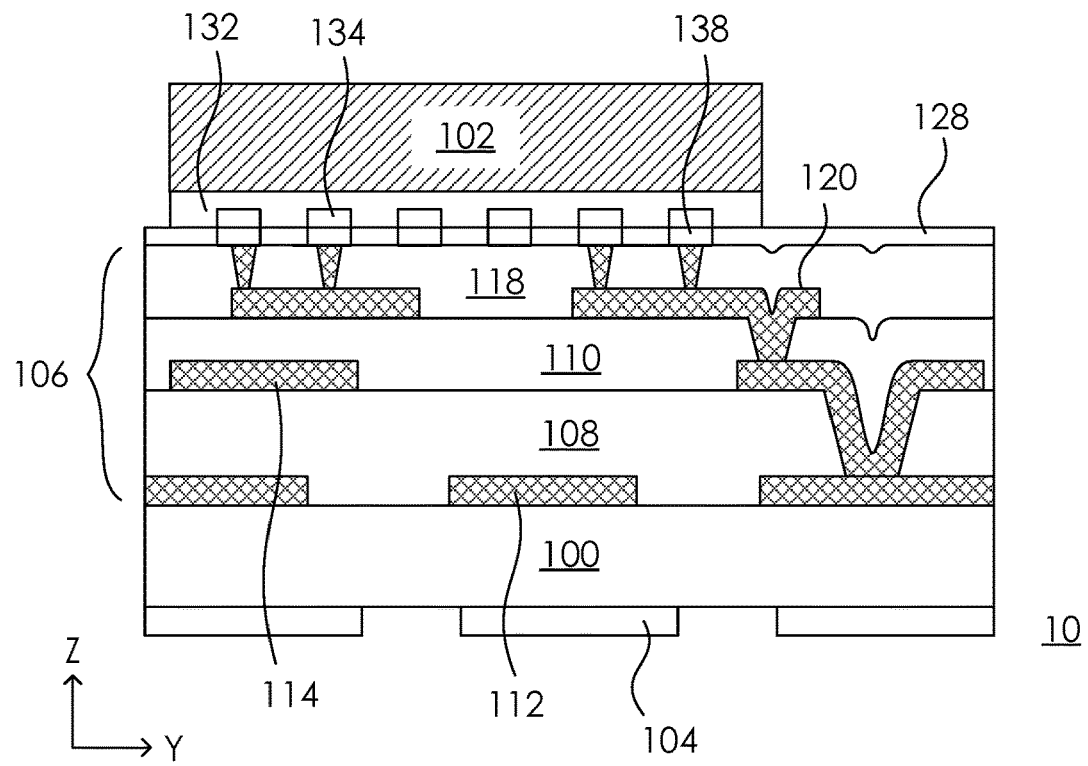
FIG. 6 illustrates a cross-sectional view of an antenna package structure according to some embodiments of the present disclosure.
Figure 7:
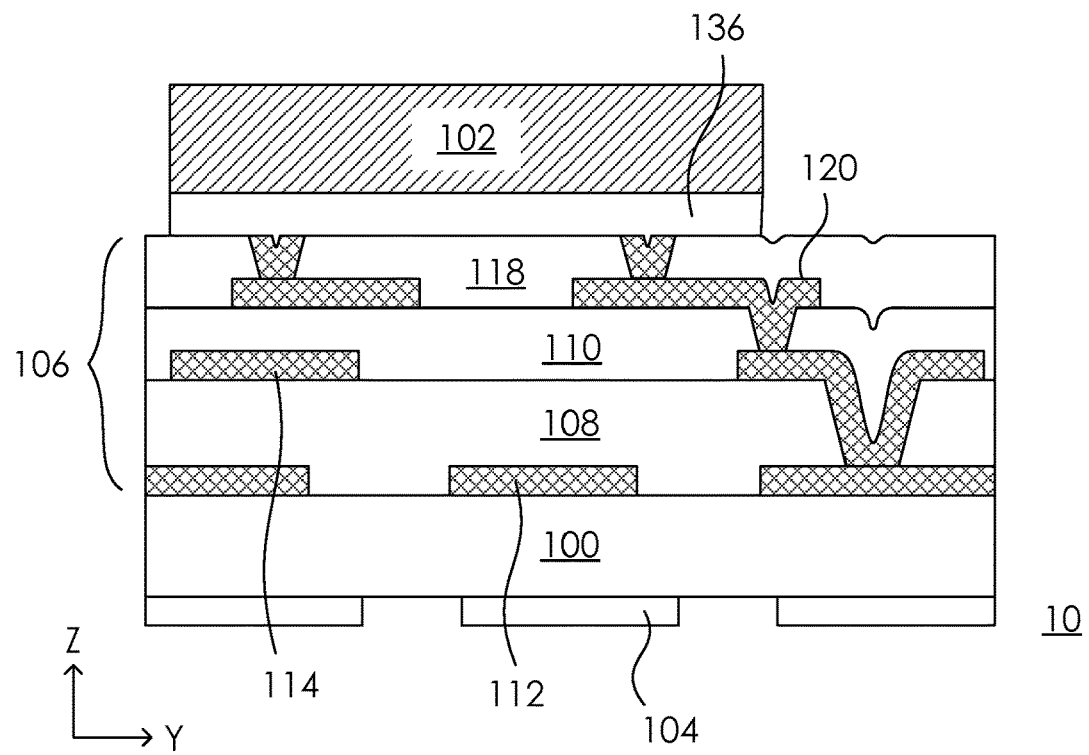
FIG. 7 illustrates a cross-sectional view of an antenna package structure according to some embodiments of the present disclosure.

Overall, each of the semiconductor chips 102 are flip-chip bonded over the glass substrate 100 (through the interconnect structure 106 sandwiched there between) to communicate with each of the antennas of the antenna array structure 104 located on another side of the substrate 100. As previously mentioned, the semiconductor chips 102 can be bonded to the interconnect structure 106 through soldering. Other than soldering, some alternative bonding technique is also feasible. In some embodiments, as shown in FIG. 5, the semiconductor chips 102 can be mounted on the interconnect structure 106 by metal bonding technique. In some embodiments, as shown in FIG. 6, the semiconductor chips 102 can be mounted on the interconnect structure 106 by hybrid bonding technique, for instance, the topmost dielectric layer of the interconnect structure 106 can be adhered to a surface dielectric layer of the semiconductor chips 102, while a plurality of conductive pads 138 distributed on and coplanar with each of the topmost dielectric layer (e.g., a first hybrid bonding dielectric layer 128) of the interconnect structure 106 and the surface dielectric layer (e.g., a second hybrid bonding dielectric layer 132) and conductive pads 134 of the semiconductor chips 102 can be bumped through an annealing process. In some embodiments, as shown in FIG. 7, the semiconductor chips 102 can be mounted over the interconnect structure 106 through a chip-on-glass (COG) technique. For example, the semiconductor chips 102 can electrically couple with the metal pads of the interconnect structure 106 by using the conductive medium 136 such as anisotropic conductive films (ACF) or non-conductive films (NCF). The selection of the bonding technique is substantially open, thus the bonding technique in mounting the semiconductor chips 102 over a side of the substrate 100 opposite to the side having the antenna array structure 104 is not limited to the exemplary embodiments as shown in FIGS. 5 to 7.

According to the embodiments of the present disclosure, an antenna package structure having a glass substrate is provided. Because of the aspects regarding the requirement of the flatness of the surfaces of the substrate and the large area requirement of the substrate, a glass substrate is thus selected, and the antenna array structure and the semiconductor chips are formed and mounted over different sides of the substrate, respectively. Furthermore, by using electromagnetic coupling technique, the antenna array structure and the semiconductor chips can be communicated by the electromagnetic signals (e.g., light signals) radiated across the substrate, without using physical via structures in the substrate. In addition, compared with some package technique such as HDI-based or LTCC-based PCB or substrates, the antenna package structure in the present disclosure has much smaller number of layers in routing, and the simplified routing can make the antenna package structure thinner, with better and faster performance, and attractive yield and cost.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An antenna package structure, comprising:
    a glass substrate having a first surface and a second surface opposite to the first surface;
    an interconnect structure disposed over the first surface of the glass substrate;
    a plurality of semiconductor chips mounted over the interconnect structure; and
    an antenna array structure formed on the second surface of the glass substrate;
    wherein the plurality of semiconductor chips are coupled to the antenna array structure through the interconnect structure and the glass substrate, and the interconnect structure comprises a plurality of dielectric layers, the plurality of dielectric layers comprises a first dielectric layer and a second dielectric layer, wherein the antenna package structure is configured to transmit a RF signal, a thickness of the first dielectric layer is corresponding with a frequency of the RF signal transmitted through the first dielectric layer, and the thickness of the first dielectric layer is greater than a thickness of the second dielectric layer.

2. The antenna package structure of claim 1, wherein the glass substrate is a via-free glass substrate.

3. The antenna package structure of claim 1, further comprising a plurality of apertures formed on the first surface of the glass substrate for coupling signals from the interconnect structure to the antenna array structure or coupling signals from the antenna array structure to the interconnect structure.

4. The antenna package structure of claim 1, wherein the glass substrate comprises a plurality of through glass vias.

5. The antenna package structure of claim 1, wherein
    the first dielectric layer is disposed on the first surface of the glass substrate, the first dielectric layer is configured to have a first redistribution layer for forming a plurality of apertures for transmitting RF signals to the antenna array structure through the glass substrate, and
    wherein the first redistribution layer is electrically connected to a ground voltage.

6. The antenna package structure of claim 5, wherein
    the second dielectric layer is disposed on the first dielectric layer and configured to have a second redistribution layer for conducting a supply power, and
    wherein the first dielectric layer is formed between the glass substrate and the second dielectric layer.

7. The antenna package structure of claim 6, wherein the interconnect structure further comprises:
    a third dielectric layer disposed on the second dielectric layer and configured to have a third redistribution layer for conducting the RF signals having a frequency in a range of from about 10 GHz to about 28 GHz;
    wherein the second dielectric layer is formed between the third dielectric layer and the first dielectric layer, and a thickness of the second dielectric layer is greater than a thickness of the third dielectric layer.

8. The antenna package structure of claim 6, wherein the thickness of the first dielectric layer is about 20 µm to about 60 µm, and the thickness of the second dielectric layer is about 10 µm.

9. The antenna package structure of claim 1, wherein the antenna array structure comprises a plurality of phased array antennas, and the phased array antennas are one-to-one mapping to the semiconductor chips.

10. The antenna package structure of claim 1, wherein the semiconductor chips comprise a plurality of transmission chips for transmitting RF signals to the antenna array structure through the interconnect structure and the glass substrate or a plurality of receiving chips for receiving RF signals from the antenna array structure through the interconnect structure and the glass substrate.

11. The antenna package structure of claim 1, wherein a side length of the glass substrate is greater than about 40 cm.

12. The antenna package structure of claim 7, wherein the third redistribution layer comprises a plurality of conductive lines exposed from a dielectric material of the third dielectric layer, and the semiconductor chips are mounted on the conductive lines.

13. An antenna package structure, comprising:
a substrate having a first surface and a second surface opposite to the first surface;
a semiconductor chip mounted over the first surface of the substrate; and
an antenna formed on the second surface of the substrate,
wherein the semiconductor chip is electromagnetically coupled to the antenna through the substrate, the conductive layers are connected by a plurality of conductive vias, each of the plurality of conductive vias comprises a dimple profile, and each of the conductive vias are staggered from each other from a projection direction, the interconnect structure further comprises:
a first dielectric layer disposed on the first surface of the substrate; and
a second dielectric layer disposed on the first dielectric layer, wherein a portion of the second dielectric layer is protruding toward the first dielectric layer through the dimple profile, and wherein a lowest point of a bottom surface of the second dielectric layer is lower than a top surface of the first dielectric layer from a cross-sectional view.

14. The antenna package structure of claim 13, wherein a thickness of the substrate is no greater than about 2 mm.

15. The antenna package structure of claim 13, further comprising an interconnect structure formed between the substrate and the semiconductor chip, wherein the interconnect structure comprises no greater than three conductive layers.

16. The antenna package structure of claim 15, wherein the interconnect structure comprises a plurality of polyimide films, wherein a thickness of each of the polyimide films is different from each other.

17. The antenna package structure of claim 15, wherein one of the conductive layers is arranged to form an aperture on the first surface of the substrate, and the aperture is configured to transmit electromagnetic signals, wherein a width of the aperture is greater than a lower limit in preventing generation of diffraction, and be less than an upper limit to transmit the electromagnetic signals.

* * * * *